United States Patent
Twu et al.

(10) Patent No.: US 6,500,274 B2
(45) Date of Patent: Dec. 31, 2002

(54) APPARATUS AND METHOD FOR WET CLEANING WAFERS WITHOUT AMMONIA VAPOR DAMAGE

(75) Inventors: Jih-Churng Twu, Chung-Ho (TW); Ming-Dar Guo, Kaoshiong (TW); Chia-Chun Cheng, Tainan (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 144 days.

(21) Appl. No.: 09/761,417

(22) Filed: Jan. 16, 2001

(65) Prior Publication Data

US 2002/0092546 A1 Jul. 18, 2002

(51) Int. Cl.[7] .................................................. B08B 3/04
(52) U.S. Cl. ........................ 134/34; 134/182; 134/186; 134/902
(58) Field of Search ............................ 134/34, 36, 182, 134/186, 902

(56) References Cited

U.S. PATENT DOCUMENTS 5,482,068 A * 1/1996 Kitahara et al. ............ 134/182
5,503,171 A * 4/1996 Yokomizo et al. .......... 134/182
6,276,379 B1 * 8/2001 Seto et al. ................... 134/182

* cited by examiner

Primary Examiner—Philip Coe
(74) Attorney, Agent, or Firm—Tung & Associates

(57) ABSTRACT

An apparatus and a method for cleaning wafers by a wet bench technique without incurring ammonia vapor damages to the wafer surface are provided. The apparatus of a wet cleaning tank consists of a tank body for holding a quantity of a cleaning solution therein; a conduit mounted through and vertical to a bottom wall of the tank body for feeding an ammonia-containing solution into the tank body through an outlet; and a cup-shaped container mounted in an upside-down position over the outlet of the conduit for blocking ammonia vapor generated by the ammonia-containing solution from reaching an upper cavity of the tank body. The method for cleaning wafers may be practiced by first positioning a conduit vertically through and with an outside wall of the conduit sealingly engaging a bottom wall of a liquid tank with an outlet end of the conduit immersed in a cleaning solution in the tank; then mounting a cup-shaped container in an upside-down position over the outlet end of the conduit to collect any ammonia vapors exiting the conduit and preventing the vapor from reaching an upper portion of the tank cavity.

20 Claims, 2 Drawing Sheets

APPARATUS AND METHOD FOR WET CLEANING WAFERS WITHOUT AMMONIA VAPOR DAMAGE

FIELD OF THE INVENTION

The present invention generally relates to an apparatus and a method for wet cleaning wafers without ammonia vapor damage and more particularly, relates to an apparatus and a method for cleaning wafers with an ammonia-containing solution by trapping ammonia vapor in a cup-shaped container immersed in the cleaning solution such that ammonia vapor does not escape into the cleaning tank to attack wafers that are being cleaned in the tank.

BACKGROUND OF THE INVENTION

Deionized water is frequently used in a wet bench process after a chemical process has been conducted on a semiconductor wafer. When residual chemical must be removed, deionized water rinse is used in a wet bench process for semiconductor wafer processing to perform two major functions of a quick dump rinse (QDR) and a cascade overflow rinse. Conventionally, the two functions are carried out in separate tanks in order to produce the desirable result. One of the major processing issues presented by the conventional dual-tank process is the particle re-deposition problem during a withdrawal step when cassettes are transported from a quick dump rinse tank to a cascade overflow tank. A second major issue is the large floor space required for accommodating the two tanks.

A conventional wet bench wafer cleaning process is shown in FIG. 1. The wet bench wafer cleaning process 10 for cleaning wafer 12 is carried out in six separate cleaning and rinsing tanks sequentially of a HF cleaning tank 14, a first quick dump rinse (QDR) tank 16, a SC-1 cleaning tank 18, a second quick dump rinse tank 20, a SC-2 cleaning tank 22 and a third quick dump rinse tank 24. The first HF cleaning tank is used to hold a diluted HF solution, for instance, at a concentration of 0.5% HF in $H_2O$ for removing a thin native oxide layer from the wafer surface. After the diluted HF cleaning process, the wafer 12 is rinsed in a first quick dump rinse tank 16 with deionized water. Wafer 12 is then cleaned in a second cleaning tank filled with SC-1 cleaning solution, i.e. a mixture of $NH_4OH$, $H_2O_2$ and DI water at a ratio of 1:1:5. The SC-1 cleaning solution is used at a temperature between 70~80° C. for a suitable time period. The wafer 12 is then rinsed again in a second quick dump rinse tank 20 that is filled with DI water. In the final stage of cleaning, the wafer 12 is cleaned in tank 22 filled with a cleaning solution of SC-2 which is a mixture of HCl, $H_2O_2$ and DI water at a ratio of 1:1:6. The wafer 12 is then rinsed in a third quick dump rinse tank 24 with DI water.

The wet bench wafer cleaning process 10 shown in FIG. 1 is conventionally used for pre-diffusion clean, pre-gate oxidation clean, pre-CVD clean, etc. For instance, in the ULSI fabrication of integrated devices, the conventional wet bench wafer cleaning process 10 can be advantageously used for wafer surface cleaning before a coating process in a CVD chamber or an oxidation process in a furnace.

Despite the fact that the conventional wet bench wafer cleaning process 10 is widely used, numerous processing difficulties of the process have been observed. For instance, during the SC-1 cleaning process carried out in tank 18, since SC-1 contains about 28% $NH_4OH$ which forms ammonia vapor in the tank cavity over the surface of the solution. When wafer 12 (or a whole wafer boat) is removed from the SC-1 cleaning solution and taken out of tank 18, ammonia vapor attacks the cleaned, bare wafer surface, i.e. the fresh silicon surface of the wafer. As a consequence, a defect known as "silicon hole" occurs wherein craters in the silicon surface are formed due to the ammonia vapor attack.

Another processing difficulty encountered in the conventional wet bench cleaning process 10 is that, in order to perform the wafer cleaning process in a reliable and repeatable manner, the concentration and temperature of the cleaning solutions in the cleaning tanks must be maintained at constant values. For instance, during a typical wafer cleaning process, the SC-1 solution in tank 18 must be constantly replenished since the components in the SC-1 solution evaporates rapidly at a temperature higher than 50° C. As a consequence, during a wafer cleaning process, fresh $NH_4OH$ must be constantly added into the SC-1 tank 18 in order to maintain a suitable concentration. A suitable method for monitoring the concentration of the SC-1 cleaning solution is by using an infrared analysis technique.

In a conventional method of adding $NH_4OH$ to the SC-1 tank 18, as shown in FIG. 2, wherein the tank 18 is further equipped with an outer tank (or an overflow tank) 26, the addition of the $NH_4OH$ liquid or any other ammonia-containing liquid further complicates the wafer cleaning process. The flow of $NH_4OH$ into the tank 18 causes agitation at the surface of the SC-1 liquid 28 and thus producing ammonia vapor 30 at or near the top surface of the SC-1 liquid 28. The ammonia vapor further presents a problem for attacking the bare, or freshly cleaned silicon wafer surface. This has been observed when $NH_4OH$ liquid was used to replenish either the SC-1 solution 28 in the SC-1 tank 18, or when the $NH_4OH$ liquid was used to replenish the SC-1 solution 32 in the outer tank 26.

It is therefore an object of the present invention to provide an apparatus for cleaning semiconductor wafers by wet bench that does not have the drawbacks or shortcomings of the conventional apparatus.

It is another object of the present invention to provide an apparatus for cleaning semiconductor wafers by wet bench without causing damages to the wafer surface by ammonia vapor.

It is a further object of the present invention to provide an apparatus for cleaning semiconductor wafers by wet bench without causing ammonia vapor damages to the wafer surface by minimizing the generation of ammonia vapor.

It is another further object of the present invention to provide an apparatus for cleaning semiconductor wafers by wet bench without causing ammonia vapor damages to the wafer surface by positioning a feed conduit for an ammonia-containing liquid through a bottom wall of a holding tank with outlet end of the conduit immersed in the cleaning solution.

It is another further object of the present invention to provide an apparatus for cleaning semiconductor wafers by wet bench without causing ammonia vapor damages to the wafer surface by positioning a feed conduit for an ammonia-containing liquid through a bottom wall of the holding tank with an outlet end of the conduit immersed in the cleaning solution and covered by a cup-shaped container such that any ammonia vapor generated is trapped in the container.

It is yet another object of the present invention to provide an apparatus for cleaning semiconductor wafers by wet bench without causing ammonia vapor damages to the wafer surface by positioning a feed conduit for an ammonia-containing liquid through a bottom wall of an outer tank with the liquid outlet end of the conduit immersed in a cleaning solution.

It is still another further object of the present invention to provide a method for cleaning semiconductor wafers by wet bench without causing ammonia vapor damages to the wafer surface by mounting a feed conduit for an ammonia-containing liquid through a bottom wall of a holding tank such that an outlet end of the feed conduit is immersed in the cleaning solution.

It is yet another further object of the present invention to provide a method for cleaning semiconductor wafers by wet bench without causing ammonia vapor damages to the wafer surface by mounting a cup-shaped container on top of a feed conduit for an ammonia-containing liquid such that any ammonia vapor generated is trapped by the cover that is immersed inside a cleaning solution.

SUMMARY OF THE INVENTION

In accordance with the present invention, an apparatus and a method for cleaning wafers by wet bench without causing ammonia vapor damages occurring to the wafer surface are provided.

In a preferred embodiment, a method for cleaning wafers by wet bench without causing ammonia vapor damages to the wafer surface can be carried out by the operating steps of first filling a tank with a quantity of a cleaning solution; positioning a conduit vertically through and with an outside wall sealingly engages a bottom wall of the tank with an outlet end of the conduit immersed in the cleaning solution; mounting a cup-shaped container in an upside-down position over the outlet end of the conduit in the cavity, the cup-shaped container retains ammonia vapor exiting the conduit and prevents the ammonia vapor from reaching an upper portion of the tank cavity; and flowing an ammonia-containing liquid through the conduit into the cavity of the tank to maintain a concentration of the cleaning solution.

The method for cleaning wafers by wet bench without ammonia vapor damage occurring to the wafer surface may further include the step of mounting an outer tank to the tank for receiving an overflow from the tank, or the step of filling the outer tank with an ammonia-containing liquid through a bottom wall of the outer tank. The method may further include the step of mounting the cup-shaped container to the conduit by mechanical means, or the step of mounting a particle trap to a second conduit for feeding the outer tank and for preventing contamination of the outer tank. The method may further include the step of flowing ammonium hydroxide through the conduit into the cavity of the tank to maintain a concentration of the cleaning solution, or the step of filling the tank with a cleaning solution mixture including ammonium hydroxide, $H_2O_2$ and deionized water. The method may further include the step of mounting the cup-shaped container to the conduit by plastic bolts that threadingly engage a sidewall of the cup-shaped container. The method may further include the step of providing the cup-shaped container in a dimension of between about 2 cm and about 10 cm in diameter and between about 2 cm and about 10 cm in height, or the step of immersing the cup-shaped container in the cleaning solution.

The present invention is further directed to a wet cleaning tank for cleaning semiconductor wafers by an ammonia-containing solution without causing ammonia vapor damage to the wafer surface including a tank body for holding a quantity of a cleaning solution therein; a conduit mounted through and vertical to a bottom wall of the tank body for feeding an ammonia-containing solution into the tank body through an outlet; and a cup-shaped container mounted in an upside-down position over the outlet of the conduit for blocking ammonia vapor from the ammonia-containing solution from reaching an upper cavity of the tank body.

The wet cleaning tank may further include an outer tank mounted to the tank body for receiving overflow from the tank body. The outer tank may be filled with an ammonia-containing liquid for flowing into the tank body for maintaining a concentration of the cleaning solution. The cup-shaped container may further include mechanical mounting means for mounting to the conduit, the mechanical mounting means may include plastic bolts threadingly engaging a sidewall of the cup-shaped container.

The wet cleaning tank may further include a second conduit for feeding the ammonia-containing liquid to the outer tank, the second conduit may be mounted through a bottom wall of the outer tank. The cleaning solution may include $NH_4OH$, $H_2O_2$ and DIW (deionized water). The ammonia-containing liquid may include $NH_4OH$. The cup-shaped container may have a dimension between about 2 cm and about 10 cm in diameter, and between about 2 cm and about 10 cm in height. The cup-shaped container may be mounted in an upside-down position with an air space therein for receiving and retaining the ammonia vapor.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
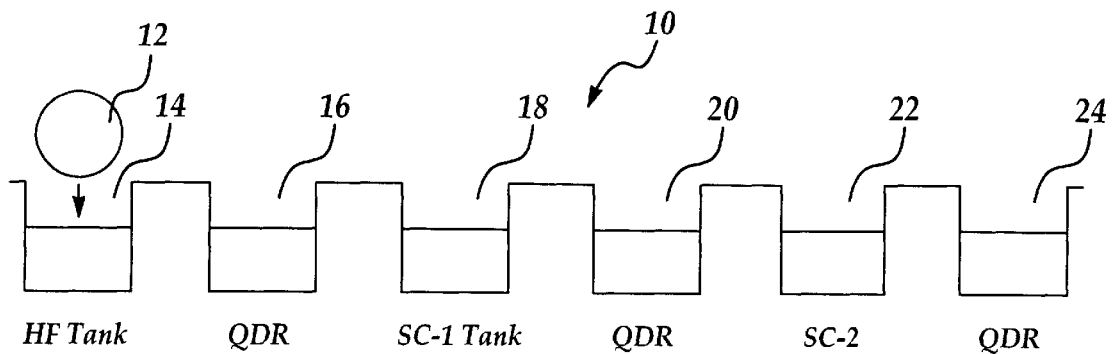
FIG. 1 is an illustration of a conventional wet bench process for cleaning semiconductor wafers.
Figure 2:
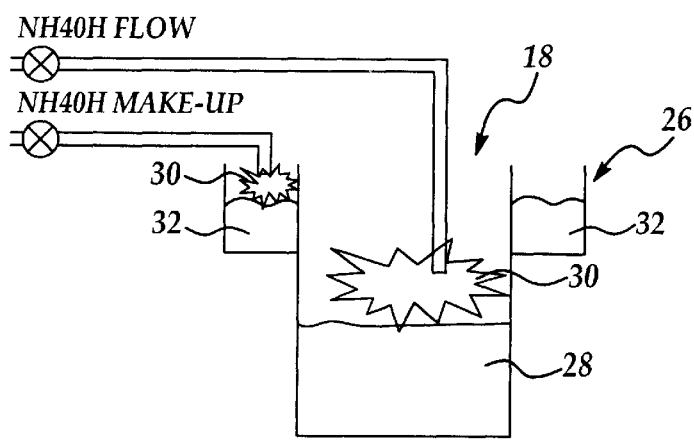
FIG. 2 is an illustration of a conventional SC-1 cleaning tank equipped with an outer, overflow tank.

The present invention discloses a wet cleaning tank for cleaning semiconductor wafers by an ammonia-containing solution without causing ammonia vapor damages occurring to the wafer surface. The wet cleaning tank includes a tank body for holding a quantity of a cleaning solution, a conduit mounted through and is vertical to a bottom wall of the tank body for feeding the ammonia-containing solution into the tank body through an outlet end of the conduit, and a cup-shaped container that is mounted in an upside-down position over the outlet of the conduit for stopping ammonia vapor generated by the ammonia-containing solution from reaching an upper cavity of the tank body. The cup-shaped container may be mounted to the feed conduit by a mechanical means, such as by plastic bolts threadingly engaging a sidewall of the cup-shaped container. The tank body may further be provided with an outer or overflow tank attached to and surrounds the tank body for receiving a possible overflow from the tank body and thus preventing any overspill from the tank body of the cleaning solution.

The invention further provides a method for cleaning semiconductor wafers by a wet bench technique without incurring ammonia vapor damages to a fresh wafer surface. The method can be carried out by providing and positioning a feed conduit vertically through and with an outside wall sealingly engaging a bottom wall of the tank, wherein an outlet end of the feed conduit is immersed in the cleaning solution. A cup-shaped container is then mounted in an upside-down position over the outlet end of the conduit in the tank cavity, the cup-shaped container retains ammonia vapor exiting the conduit and thus preventing the ammonia vapor from reaching an upper portion of the tank cavity.

During the wet bench cleaning process for the semiconductor wafer, an ammonia-containing liquid is flown through the conduit continuously into the cavity of the tank in order to maintain a predetermined concentration of the cleaning solution. The method may further include mounting an outer or overflow tank to the tank body for receiving any possible overflow from the tank body. The cup-shaped container may be mounted to the feed conduit by mechanical means such as by plastic bolts that threadingly engages a sidewall of the cup-shaped container with the tips of the bolts compressing against the feed conduit.

The present invention novel apparatus and method therefore provides an ammonia vapor-free wet cleaning tank for wet bench cleaning of semiconductor wafers. Any ammonia vapor generated by the cleaning tank is trapped and retained in the cup-shaped container mounted immersed in the cleaning solution. When the ammonia vapor reaches a high concentration, or to a saturated state, the vapor dissolves in the cleaning solution for use in cleaning the wafer surfaces.

Moreover, the present invention novel apparatus of the wet bench cleaning tank is equipped with a feed conduit that feeds an ammonia-containing liquid into the cleaning tank in an upward manner instead of in a downward manner, such as that used in the conventional wet cleaning tank. The upward feeding of liquid for replenishing the cleaning solution not only avoids the generation of any turbulent flow in the cleaning solution, but also provides the unique setup of the present invention utilizing the cup-shaped container for trapping any ammonia vapor generated and preventing the vapor from reaching an upper portion of the cleaning tank. The entrapment of the ammonia vapor thus prevents cleaned wafers having fresh surfaces when leaving the cleaning tank from being attacked by the ammonia vapor.

Figure 3:
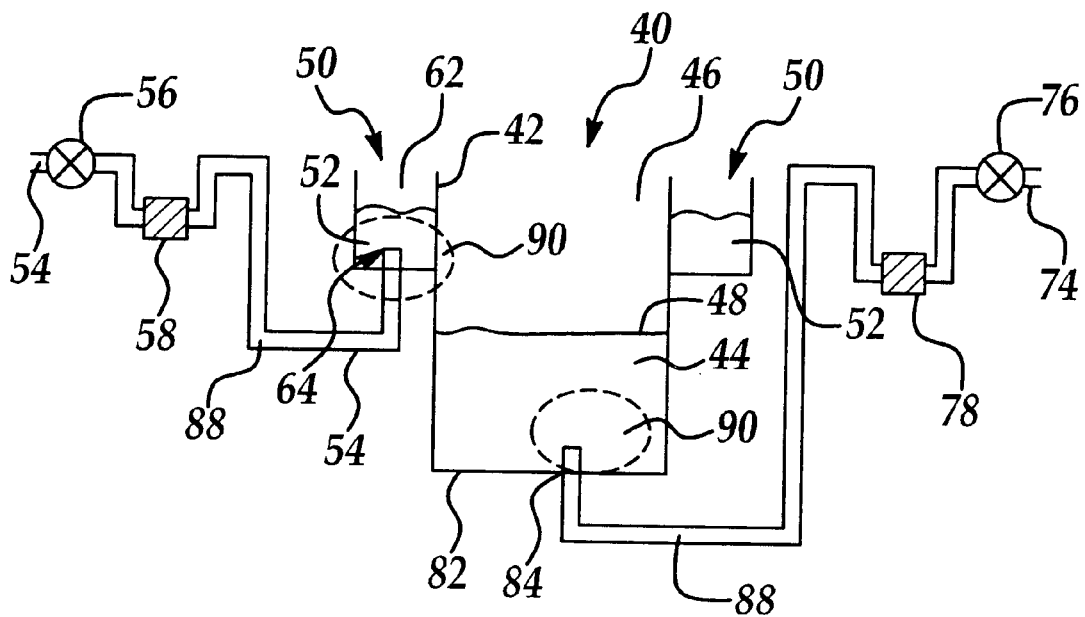
FIG. 3 is an illustration of a present invention SC-1 cleaning tank equipped with a feed conduit through a bottom wall of the tank.

Referring now to FIG. 3, wherein a present invention SC-1 tank 40 is shown. The SC-1 tank 40 is constructed by a tank body 42 onto which an outer or overflow tank 50 is attached. A SC-1 cleaning solution 44 is filled into a tank cavity 46 to form a top liquid surface 48. Similarly, a SC-1 solution 52 fills the outer tank 50 which may also be used to adjust the liquid level inside the main tank cavity 46.

As shown in FIG. 3, an ammonia-containing liquid, i.e. $NH_4OH$, is fed into both the main tank cavity 46 and the outer tank 50. The feed conduit 54 is used for feeding the ammonia-containing liquid 52 into the outer tank 50 through a flow control valve 56 and a particulate trap 58 to filter out any contaminants contained in the liquid 52. The feed conduit 54 is connected in fluid communication with the cavity 62 of the outer tank 50 through a bottom opening 64 of the outer tank 50. Similarly, feed conduit 74 is used to feed the cavity 46 of the main tank 40 through a flow control valve 76, a particulate trap 78 and a bottom opening 84 provided in the bottom wall 82 of the main SC-1 tank 40. A detailed view of the present invention cup-shaped container 90 for receiving and retaining any ammonia vapor is shown in FIG. 3A.

Figure 3A:
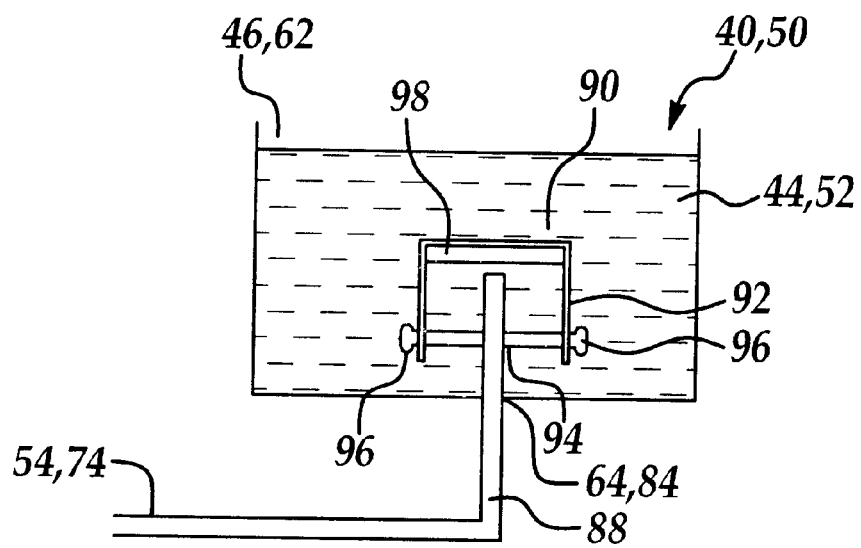
FIG. 3A is an enlarged, cross-sectional view of the present invention feed conduit and the cup-shaped container for retaining ammonia vapor.

A detailed, cross-sectional view of the present invention cup-shaped container 90 positioned inside a tank 40 or 50 is shown in FIG. 3A. Through a bottom opening 64 or 84 of the tank 40 or 50, respectively, a feed conduit 54 or 74 is used to provide fluid communication with the cavity 46 or 62 of the tank 40 or 50. The cup-shaped container 90 may be suitably provided in a dimension such as between about 2 cm and about 10 cm in diameter, and between about 2 cm and about 10 cm in height. The container 90 may further be fabricated in a material that is not susceptible to chemical erosion by the cleaning solution 44 or 52.

The cup-shaped container 90 may be suitably mounted to the feed conduit 54 or 74 by any suitable mechanical means. One of such suitable mechanical means is to simply provide at least two, or preferably at least three plastic bolts 96 which threadingly engage the sidewall 92 of the container 90 while a free end 94 of the plastic bolts 96 compresses against the feed conduit 54 or 74. As shown in FIG. 3A, any ammonia vapor would be received and retained by the upper cavity 98 inside the cup-shaped container 92. When the concentration of the ammonia vapor accumulates to a high degree, or to a saturation point, the ammonia vapor will dissolve in the cleaning solution 44 or 52 and thus becomes part of the cleaning solution composition. As shown in FIG. 3A, the present invention novel cup-shaped container 90 effectively entraps any ammonia vapor that may be generated from the feed conduit 54 or 74 when feeding an ammonia-containing liquid 88 into the tank cavity 46 or 62.

The present invention novel apparatus and method for cleaning wafers by a wet bench technique without incurring any ammonia vapor damages to the wafer surface have therefore been amply described in the above description and in the appended drawings of FIGS. 3 and 3A.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A method for cleaning wafers by wet bench without ammonia vapor damage comprising the steps of:
    filling a cavity of a tank with a quantity of a cleaning solution;
    positioning a conduit vertically through and with an outside wall sealingly engaging a bottom wall of the tank with an outlet end of said conduit immersed in said cleaning solution;
    mounting a cup-shaped container in an upside-down position over said outlet end of said conduit in the cavity, said cup-shaped container retains ammonia vapor exiting said conduit and prevents said ammonia vapor from reaching an upper portion of the tank cavity; and
    flowing an ammonia-containing liquid through said conduit into said cavity of the tank to maintain a concentration of said cleaning solution.

2. A method for cleaning wafers by wet bench without ammonia vapor damage according to claim 1 further comprising the step of mounting an outer tank to said tank for receiving an overflow from said tank.

3. A method for cleaning wafers by wet bench without ammonia vapor damage according to claim 2 further comprising the step of filling said outer tank with an ammonia-containing liquid through a bottom wall of said outer tank.

4. A method for cleaning wafers by wet bench without ammonia vapor damage according to claim 2 further comprising the step of mounting a particle trap to a second conduit for feeding said outer tank and for preventing contamination of said outer tank.

5. A method for cleaning wafers by wet bench without ammonia vapor damage according to claim 1 further comprising the step of mounting said cup-shaped container to said conduit by mechanical means.

6. A method for cleaning wafers by wet bench without ammonia vapor damage according to claim 5 further comprising the step of mounting said cup-shaped container to said conduit by plastic bolts that threadingly engage a sidewall of said cup-shaped container.

7. A method for cleaning wafers by wet bench without ammonia vapor damage according to claim 1 further comprising the step of flowing ammonium hydroxide through said conduit into said cavity of the tank to maintain a concentration of said cleaning solution.

8. A method for cleaning wafers by wet bench without ammonia vapor damage according to claim 1 further comprising the step of filling said tank with a cleaning solution mixture comprising ammonium hydroxide, $H_2O_2$ and deionized water.

9. A method for cleaning wafers by wet bench without ammonia vapor damage according to claim 1 further comprising the step of providing said cup-shaped container in a dimension of between about 2 cm and about 10 cm in diameter and between about 2 cm and about 10 cm in height.

10. A method for cleaning wafers by wet bench without ammonia vapor damage according to claim 1 further comprising the step of immersing said cup-shaped container in said cleaning solution.

11. A wet cleaning tank for cleaning semiconductor wafers by an ammonia-containing solution without ammonia vapor damage to the wafers comprising:

a tank body for holding a quantity of a cleaning solution therein;

a conduit mounted through and vertical to a bottom wall of said tank body for feeding an ammonia-containing solution into said tank body through an outlet; and a cup-shaped container mounted in an upside-down position over said outlet of said conduit for stopping ammonia vapor generated by said ammonia-containing solution from reaching an upper cavity of said tank body.

12. A wet cleaning tank for cleaning semiconductor wafers by an ammonia-containing solution without ammonia vapor damage to the wafers according to claim 11 further comprising an outer tank mounted to said tank body for receiving an overflow from said tank body.

13. A wet cleaning tank for cleaning semiconductor wafers by an ammonia-containing solution without ammonia vapor damage to the wafers according to claim 12, wherein said outer tank being filled with an ammonia-containing liquid for flowing into said tank body for maintaining a concentration of said cleaning solution.

14. A wet cleaning tank for cleaning semiconductor wafers by an ammonia-containing solution without ammonia vapor damage to the wafers according to claim 12 further comprising a second conduit for feeding said ammonia-containing liquid to said outer tank, said second conduit being mounted through a bottom wall of said outer tank.

15. A wet cleaning tank for cleaning semiconductor wafers by an ammonia-containing solution without ammonia vapor damage to the wafers according to claim 11, wherein said cup-shaped container further comprises mechanical mounting means for mounting to said conduit.

16. A wet cleaning tank for cleaning semiconductor wafers by an ammonia-containing solution without ammonia vapor damage to the wafers according to claim 15, wherein said mechanical mounting means comprises plastic bolts threadingly engaging a sidewall of said cup-shaped container.

17. A wet cleaning tank for cleaning semiconductor wafers by an ammonia-containing solution without ammonia vapor damage to the wafers according to claim 11, wherein said cleaning solution comprises $NH_4OH$, $H_2O_2$ and DIW (deionized water).

18. A wet cleaning tank for cleaning semiconductor wafers by an ammonia-containing solution without ammonia vapor damage to the wafers according to claim 11, wherein said ammonia-containing liquid comprises $NH_4OH$.

19. A wet cleaning tank for cleaning semiconductor wafers by an ammonia-containing solution without ammonia vapor damage to the wafers according to claim 11, wherein said cup-shaped container has a dimension of between about 2 cm and about 10 cm in diameter, and between about 2 cm and about 10 cm in height.

20. A wet cleaning tank for cleaning semiconductor wafers by an ammonia-containing solution without ammonia vapor damage to the wafers according to claim 11, wherein said cup-shaped container being mounted in an upside-down position having an air space therein for receiving and retaining said ammonia vapor.

* * * * *